United States Patent
Wu et al.

(10) Patent No.: US 10,804,465 B2
(45) Date of Patent: Oct. 13, 2020

(54) RESISTIVE RANDOM ACCESS MEMORY AND MANUFACTURING METHOD THEREOF

(71) Applicant: Tsinghua University, Beijing (CN)

(72) Inventors: Huaqiang Wu, Beijing (CN); Wei Wu, Beijing (CN); Bin Gao, Beijing (CN); He Qian, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 16/123,234

(22) Filed: Sep. 6, 2018

(65) Prior Publication Data
US 2019/0074435 A1 Mar. 7, 2019

(30) Foreign Application Priority Data
Sep. 7, 2017 (CN) .......................... 2017 1 0801908

(51) Int. Cl.
*H01L 45/00* (2006.01)

(52) U.S. Cl.
CPC ............ *H01L 45/128* (2013.01); *H01L 45/06* (2013.01); *H01L 45/08* (2013.01); *H01L 45/1233* (2013.01); *H01L 45/146* (2013.01); *H01L 45/1608* (2013.01); *H01L 45/1675* (2013.01); *H01L 45/144* (2013.01)

(58) Field of Classification Search
CPC ... H01L 45/128; H01L 45/08; H01L 45/1608; H01L 45/1233; H01L 45/1675; H01L 45/06; H01L 45/146; H01L 45/144; H01L 45/16
See application file for complete search history.

(56) References Cited

U.S. PATENT DOCUMENTS

2016/0043142 A1* 2/2016 Hong ...................... H01L 45/08
257/4
2017/0365640 A1* 12/2017 Kim .................... H01L 27/2418

* cited by examiner

*Primary Examiner* — David Vu
(74) *Attorney, Agent, or Firm* — Loeb & Loeb LLP

(57) ABSTRACT

A resistive random access memory and a manufacture method thereof are provided. The resistive random access memory includes: a first electrode, a second electrode, a resistive layer between the first electrode and the second electrode, and at least one thermal enhanced layer; the thermal enhanced layer is adjacent to the resistive layer, and a thermal conductivity of the thermal enhanced layer is less than a thermal conductivity of the first electrode and a thermal conductivity of the second electrode.

13 Claims, 16 Drawing Sheets

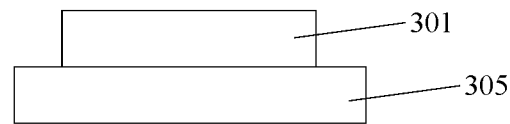
Fig. 11A
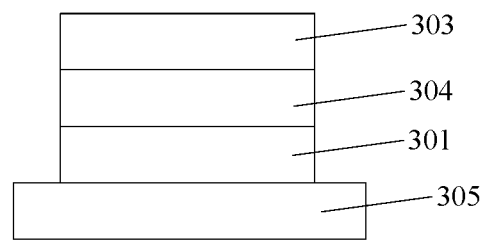
Fig. 11B1
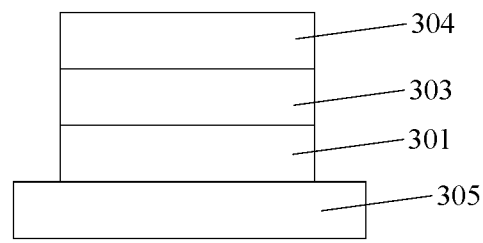
Fig. 11B2
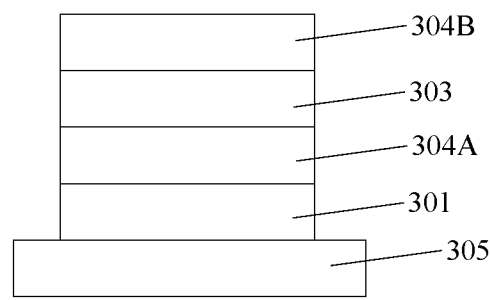
Fig. 11B3

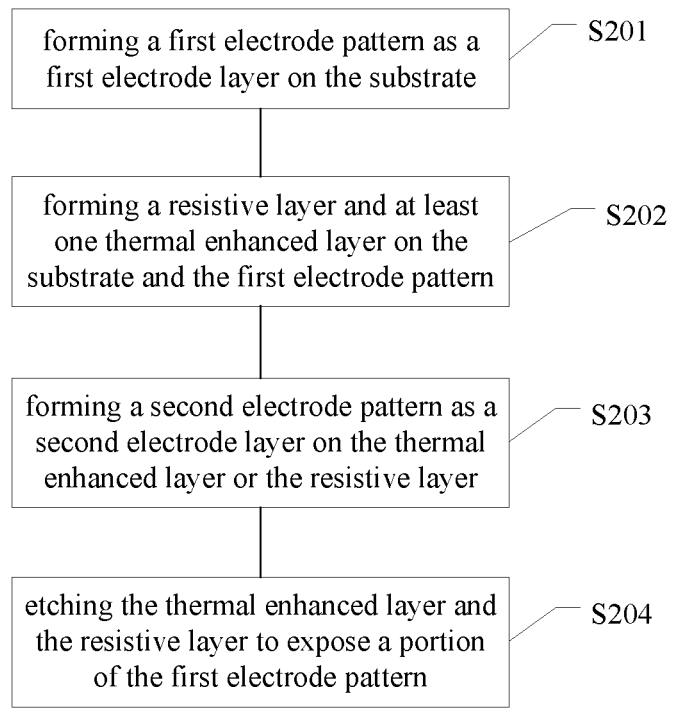
Fig. 12
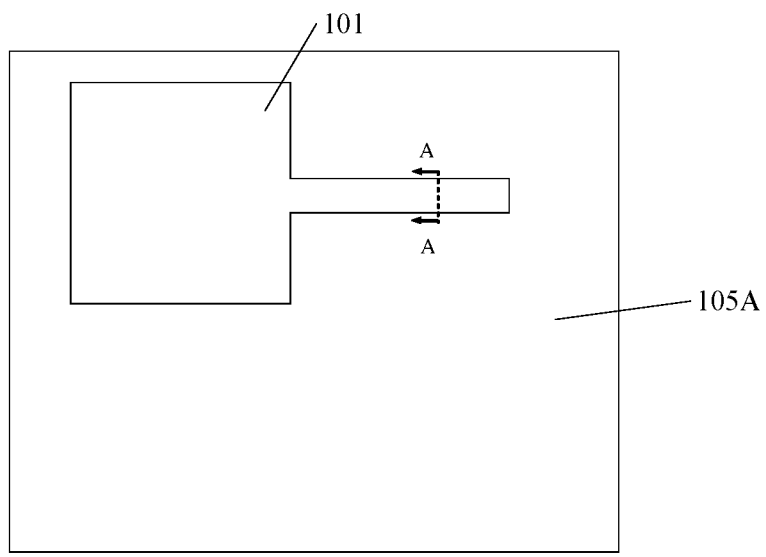
Fig. 13A1

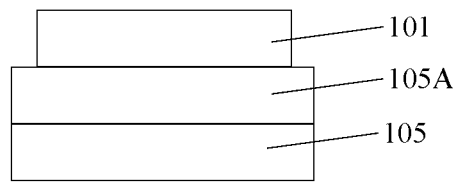
Fig. 13A2
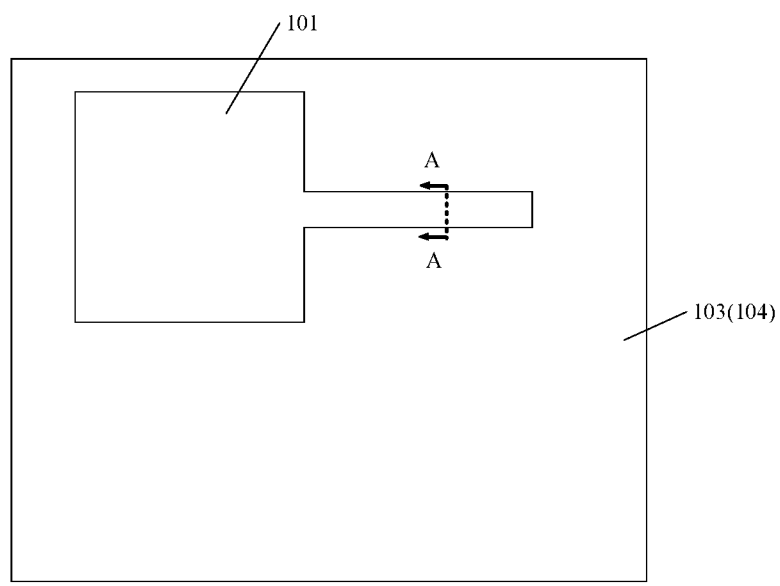
Fig. 13B1
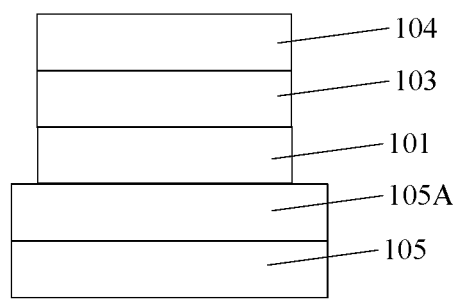
Fig. 13B2

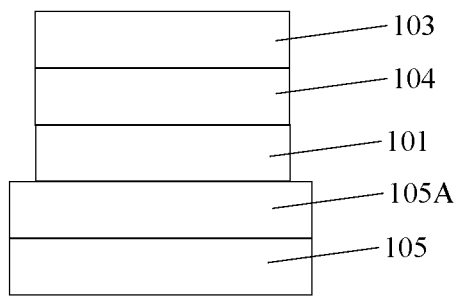
Fig. 13B3
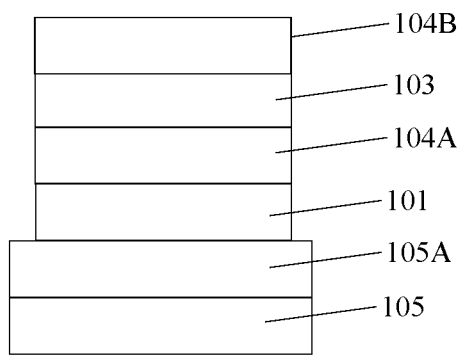
Fig. 13B4
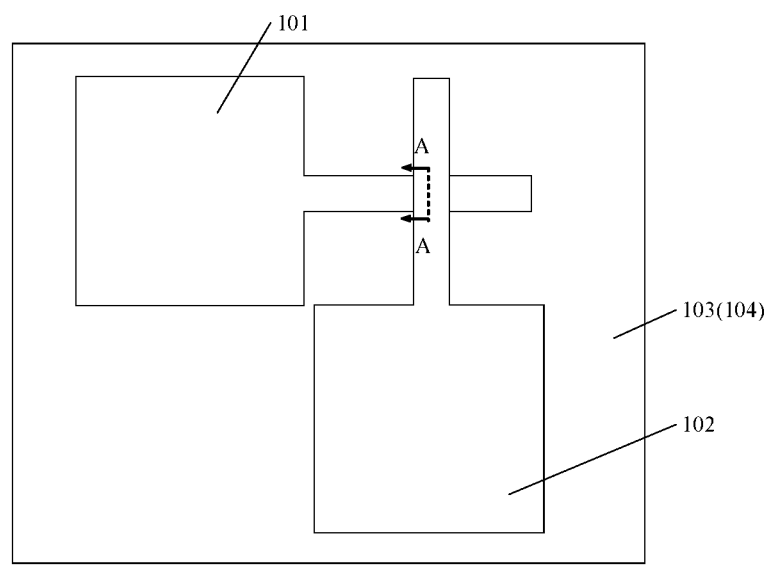
Fig. 13C1

Fig. 13C2

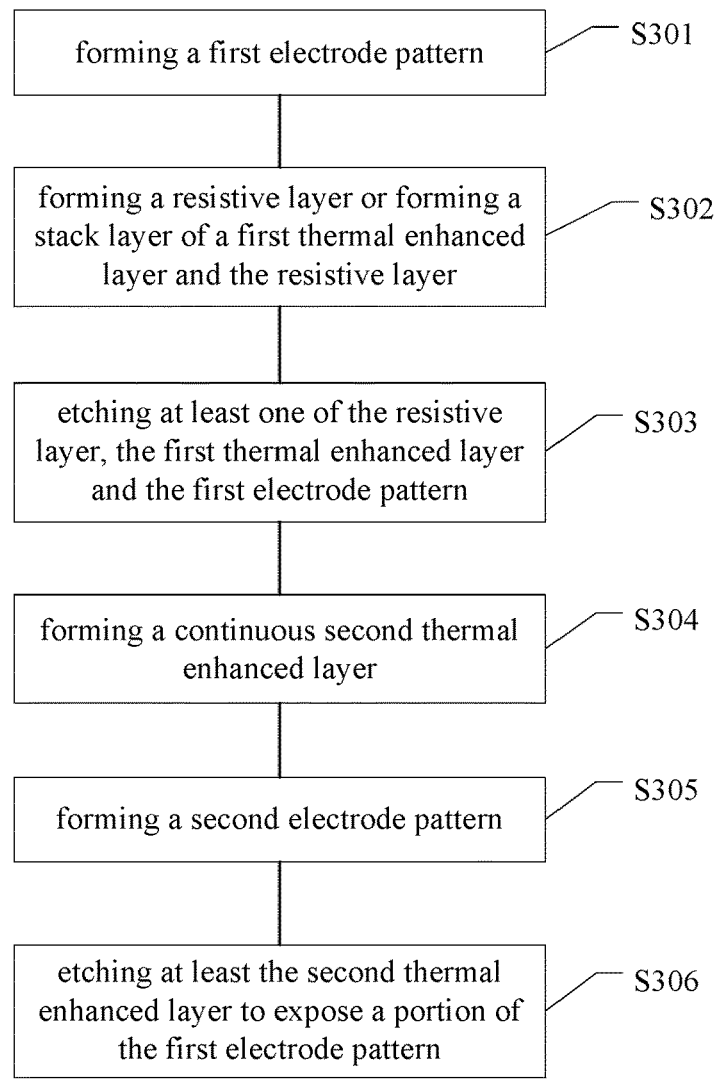
Fig. 14
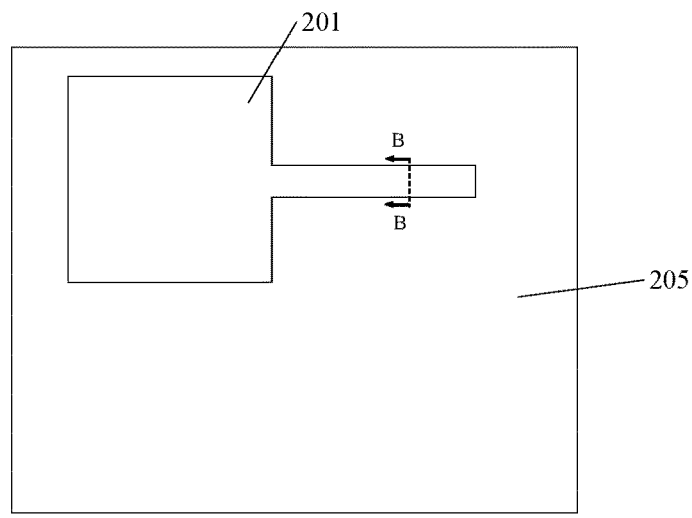
Fig. 15A1

Fig. 15A2
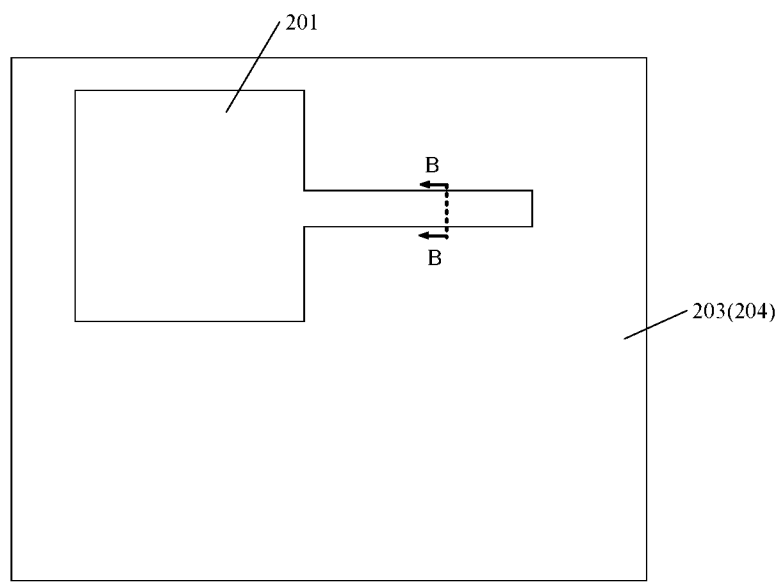
Fig. 15B1
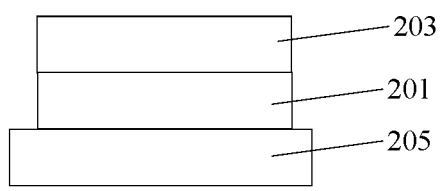
Fig. 15B2

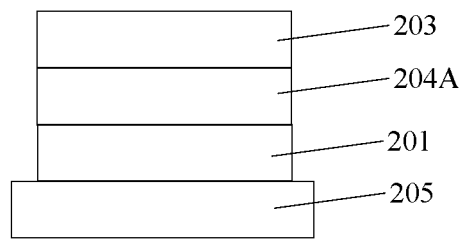
Fig. 15B3
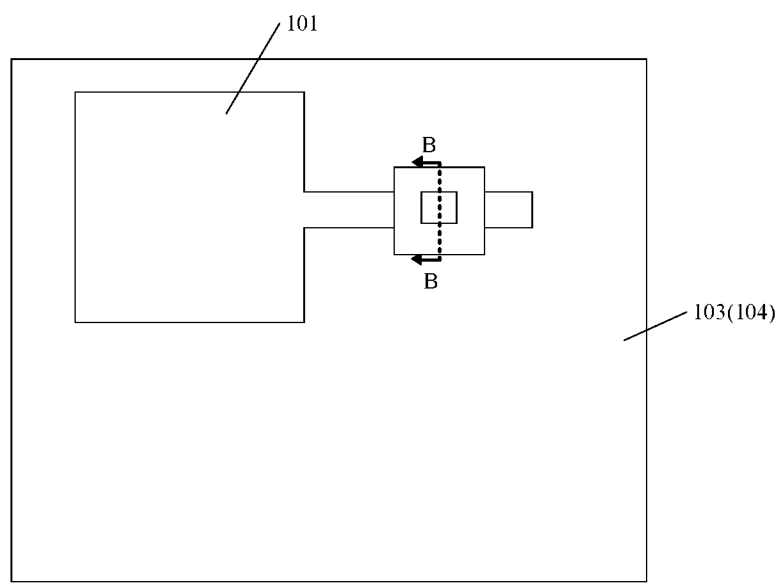
Fig. 15C1
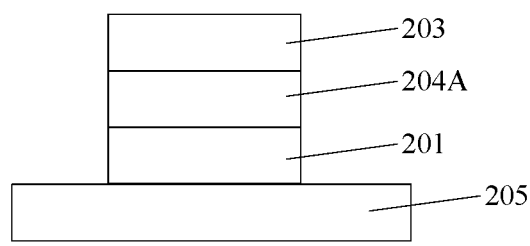
Fig. 15C2

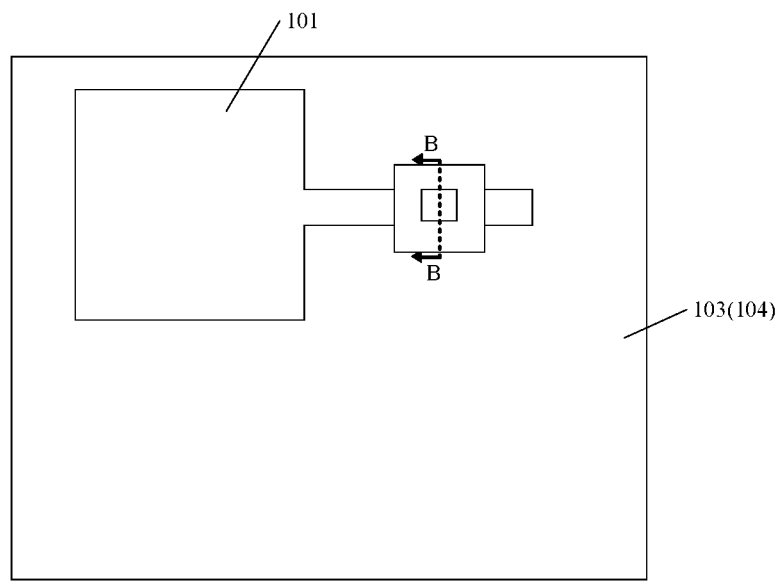
Fig. 15D1
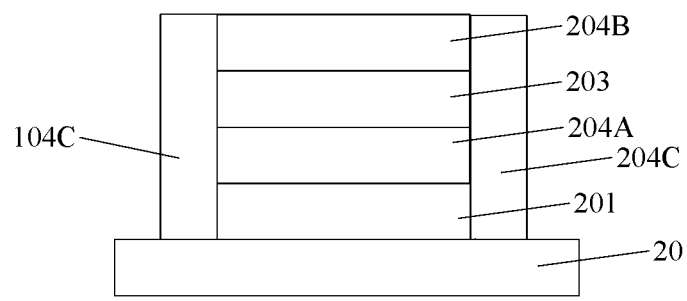
Fig. 15D2
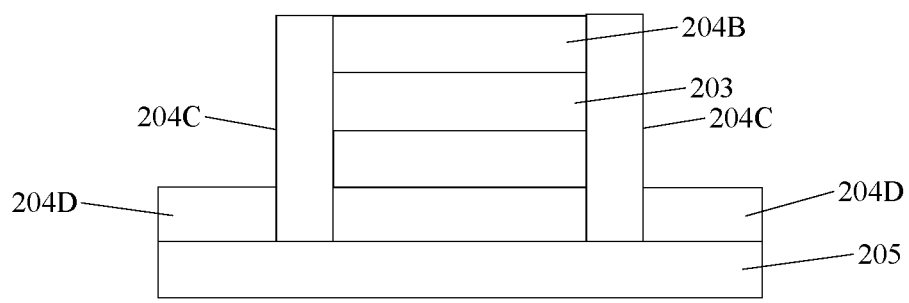
Fig. 15D3

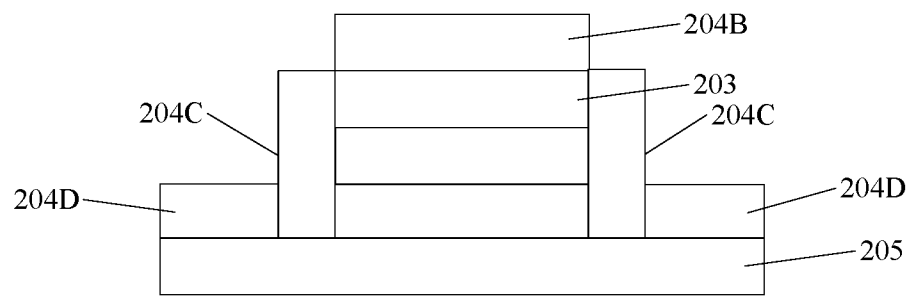
Fig. 15D4
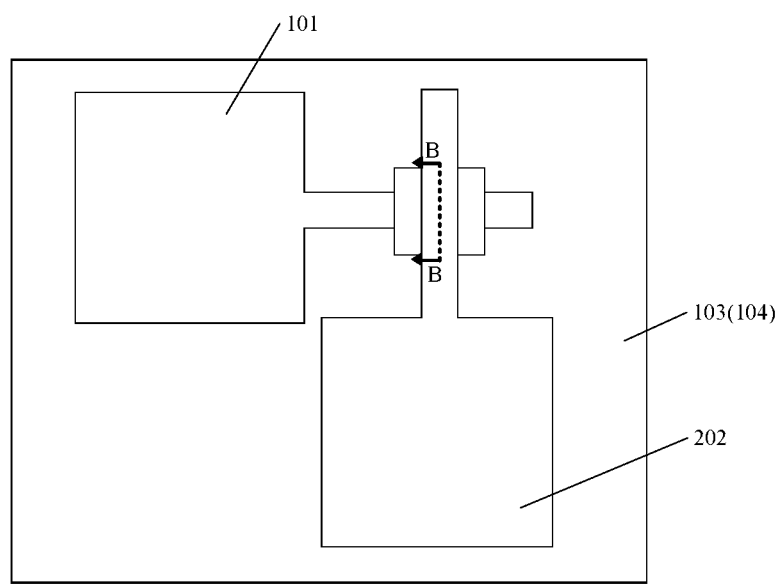
Fig. 15E1

RESISTIVE RANDOM ACCESS MEMORY AND MANUFACTURING METHOD THEREOF

CROSS REFERENCE TO RELATED APPLICATION

The present application claims priority to the Chinese patent application No. 201710801908.6, filed on Sep. 7, 2017, the entire disclosure of which is incorporated herein by reference as part of the present application.

TECHNICAL FIELD

Embodiments of the present disclosure relate to a resistive random access memory and a manufacturing method thereof.

BACKGROUND

A resistive random access memory (RRAM) is a device that uses a change of the resistance of a material to store data. A storage principle of the RRAM is that some film materials have different resistance states, and can be converted in the different resistance states under a certain voltage, and therefore the data can be stored. The RRAM has advantages of low power consumption, a low operation voltage, a fast read and write speed, and so on, and therefore are widely used.

SUMMARY

At least one embodiment of the present disclosure provides a resistive random access memory (RRAM), the resistive random access memory comprises: a first electrode, a second electrode, a resistive layer between the first electrode and the second electrode, and at least one thermal enhanced layer; the thermal enhanced layer is adjacent to the resistive layer, and a thermal conductivity of the thermal enhanced layer is less than a thermal conductivity of the first electrode and a thermal conductivity of the second electrode.

For example, in the resistive random access memory provided by at least one embodiment of the present disclosure, the thermal conductivity of the first electrode and/or the thermal conductivity of the second electrode are/is twice, five times or more than ten times as high as the thermal conductivity of the thermal enhanced layer.

For example, in the resistive random access memory provided by at least one embodiment of the present disclosure, a thermal conductivity of a material of the thermal enhanced layer ranges from 0.01 W·m$^{-1}$·K$^{-1}$ to 20 W·m$^{-1}$·K$^{-1}$.

For example, in the resistive random access memory provided by at least one embodiment of the present disclosure, the thermal enhanced layer is above the resistive layer, and/or below the resistive layer, and/or on a lateral side of the resistive layer.

For example, the resistive random access memory provided by at least one embodiment of the present disclosure further comprises a substrate, and the first electrode, the second electrode, the resistive layer, and the thermal enhanced layer are on the substrate.

For example, in the resistive random access memory provided by at least one embodiment of the present disclosure, a material of the substrate comprises silicon and/or silicon oxide.

For example, in the resistive random access memory provided by at least one embodiment of the present disclosure, a material of the first electrode and/or a material of the second electrode comprises Ti, Al, Ni, Ag, Au, W, Cu, Pt, Pd or TiN.

For example, in the resistive random access memory provided by at least one embodiment of the present disclosure, a material of the resistive layer comprises transition metal oxide.

For example, in the resistive random access memory provided by at least one embodiment of the present disclosure, the transition metal oxide comprises AlO$_x$, TaO$_x$, HfO$_x$, SiO$_x$, TiO$_x$ or WO$_x$.

For example, in the resistive random access memory provided by at least one embodiment of the present disclosure, a thickness of the resistive layer ranges from 1 nm to 30 nm.

For example, in the resistive random access memory provided by at least one embodiment of the present disclosure, an electrical conductivity of a material of the thermal enhanced layer ranges from 10 μΩ/cm$^2$ to 10 Ω/cm$^2$.

For example, in the resistive random access memory provided by at least one embodiment of the present disclosure, a material of the thermal enhanced layer comprises anoxic metal oxide or a phase change material.

For example, in the resistive random access memory provided by at least one embodiment of the present disclosure, the anoxic metal oxide comprises AlO$_x$, HfO$_x$, SiO$_x$, TiO$_x$, TaO$_x$ or WO$_x$; alternatively, the phase change material comprises GST.

For example, in the resistive random access memory provided by at least one embodiment of the present disclosure, a thickness of the thermal enhanced layer ranges from 10 nm to 200 nm.

At least one embodiment of the present disclosure provides a method of manufacturing a resistive random access memory, the manufacture method comprises: providing a substrate; forming a first electrode layer on the substrate; forming a resistive layer and at least one thermal enhanced layer on the first electrode layer; and forming a second electrode layer on the resistive layer or the thermal enhanced layer.

For example, the method of manufacturing the resistive random access memory provided by at least one embodiment of the present disclosure further comprises: etching the second electrode layer, the thermal enhanced layer, the resistive layer, and the first electrode layer to form a pattern by a single photolithography process.

For example, the method of manufacturing the resistive random access memory provided by at least one embodiment of the present disclosure further comprises: forming the thermal enhanced layer on a lateral side of the resistive layer and/or a side of the first electrode layer.

For example, in the method of manufacturing the resistive random access memory provided by at least one embodiment of the present disclosure, a first electrode pattern is formed on the substrate as the first electrode layer; the resistive layer and the at least one thermal enhanced layer are formed on the substrate and the first electrode pattern; a second electrode pattern is formed on the thermal enhanced layer or the resistive layer as the second electrode layer; and the thermal enhanced layer and the resistive layer are etched to expose a portion of the first electrode pattern.

For example, in the method of manufacturing a resistive random access memory provided by at least one embodiment of the present disclosure, the thermal enhanced layer and the resistive layer are etched by a single photolithography process.

At least one embodiment of the present disclosure provides a method of manufacturing a resistive random access memory, comprising: providing a substrate; forming a first electrode pattern on the substrate; forming a resistive layer on the substrate and the first electrode pattern, or forming a stack layer of a first thermal enhanced layer and the resistive layer on the substrate and the first electrode pattern; etching one of the resistive layer, the first thermal enhanced layer and the first electrode pattern to expose at least a portion of one of a lateral side of the resistive layer, a lateral side of the first thermal enhanced layer, and a lateral side of the first electrode pattern; forming a continuous second thermal enhanced layer on a surface of the substrate, a surface of the resistive layer, and at least the portion of one of the lateral side of the resistive layer, the lateral side of the first thermal enhanced layer and the lateral side of the first electrode pattern; forming a second electrode pattern on the second thermal enhanced layer; and etching at least the second thermal enhanced layer to expose a portion of the first electrode pattern.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIGS. 11A-11E are plane diagrams and cross-sectional diagrams of a resistive random access memory in a manufacture process provided by an embodiment of the present disclosure;

FIG. 12 is a flow chart of a method of manufacturing a resistive random access memory provided by an embodiment of the present disclosure;

FIGS. 13A1-13D are plane diagrams and cross-sectional diagrams of a resistive random access memory in a manufacture process provided by an embodiment of the present disclosure;

FIG. 14 is a flow chart of a method of manufacturing a resistive random access memory provided by an embodiment of the present disclosure; and FIGS. 15A1-15F are plane diagrams and cross-sectional diagrams of a resistive random access memory in a manufacture process provided by an embodiment of the present disclosure.

DETAILED DESCRIPTION

Figure 1:
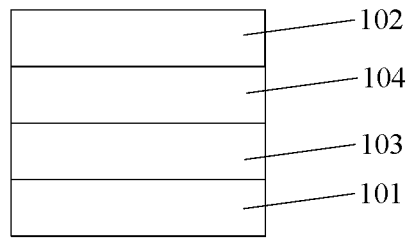
FIG. 1 is a first schematic diagram of a resistive random access memory provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Under a condition that an external pulse is applied to a common resistive random access memory, the conductance of the common resistive random access memory can continuously change only during a process of conductance decreasing, and in a process of increasing conductance, the conductance usually shows a sudden change, and the sudden change may seriously affect the performance of the memory.

At least one embodiment of the present disclosure provides a resistive random access memory (RRAM), the resistive random access memory comprises: a first electrode, a second electrode, a resistive layer between the first electrode and the second electrode, and at least one thermal enhanced layer; the thermal enhanced layer is adjacent to the resistive layer, and a thermal conductivity of the thermal enhanced layer is less than a thermal conductivity of the first electrode and a thermal conductivity of the second electrode.

At least one embodiment of the present disclosure provides a method of manufacturing a resistive random access memory, the manufacture method comprises: providing a substrate; forming a first electrode layer on the substrate; forming a resistive layer and at least one thermal enhanced layer on the first electrode layer; and forming a second electrode layer on the resistive layer or the thermal enhanced layer.

At least one embodiment of the present disclosure provides a method of manufacturing a resistive random access memory, comprising: providing a substrate; forming a first electrode pattern on the substrate; forming a resistive layer on the substrate and the first electrode pattern, or forming a stack layer of a first thermal enhanced layer and the resistive layer on the substrate and the first electrode pattern; etching one of the resistive layer, the first thermal enhanced layer and the first electrode pattern to expose at least a portion of one of a lateral side of the resistive layer, a lateral side of the first thermal enhanced layer, and a lateral side of the first electrode pattern; forming a continuous second thermal enhanced layer on a surface of the substrate, a surface of the resistive layer, and at least the portion of one of the lateral side of the resistive layer, the lateral side of the first thermal enhanced layer and the lateral side of the first electrode pattern; forming a second electrode pattern on the second thermal enhanced layer; and etching at least the second thermal enhanced layer to expose a portion of the first electrode pattern.

The resistive random access memory and the manufacture method thereof provided by the present disclosure are described below by several specific embodiments.

At least one embodiment of the present disclosure provides a random access memory, as illustrated in FIG. 1, the resistive random access memory comprises a first electrode 101, a second electrode 102, a resistive layer 103 between the first electrode 101 and the second electrode 102, and at least one thermal enhanced layer 104; the thermal enhanced layer 104 is adjacent to the resistive layer 103, and a thermal conductivity of the thermal enhanced layer 104 is less than a thermal conductivity of the first electrode 101 and a thermal conductivity of the second electrode 102.

For example, in the embodiment, thermal conductivities of both the first electrode 101 and the second electrode 102 can be twice, five times or more than ten times as high as the thermal conductivity of the thermal enhanced layer 104. At this situation, the thermal conductivity of the thermal enhanced layer 104 is much smaller than the thermal conductivities of the first electrode 101 and the second electrode 102, so that the added thermal enhanced layer 104 can preserve the heat generated by the resistive layer 103 during operation to a certain extent, thus heat loss can be prevented, or a speed of the heat loss can be slowed down, and furthermore the formation of the conductive filaments in the resistive layer 103 can be affected by the thermal effect, the conductive filaments in the resistive layer 103 are formed to be more dispersed, and therefore the conductance of the resistive random access memory can continuously change, under a condition that an external pulse is applied to the resistive random access memory, during both the process of conductance decreasing and the process of conductance increasing.

Figure 2:
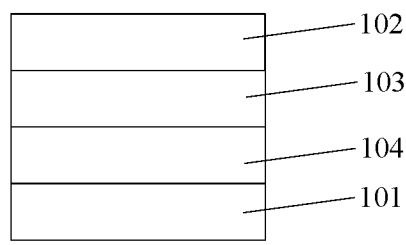
FIG. 2 is a second schematic diagram of a resistive random access memory provided by an embodiment of the present disclosure.
Figure 3:
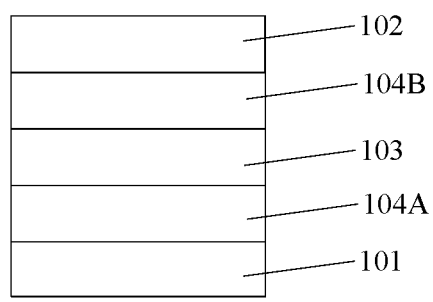
FIG. 3 is third schematic diagram of a resistive random access memory provided by an embodiment of the present disclosure.
Figure 4:
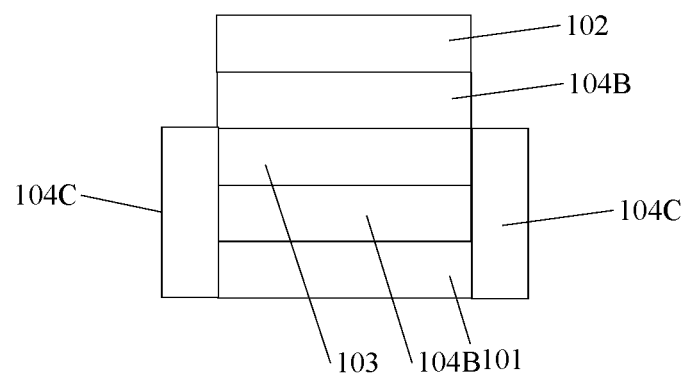
FIG. 4 is a fourth schematic diagram of a resistive random access memory provided by an embodiment of the present disclosure.

For example, in the embodiment, the thermal enhanced layer 104 is above the resistive layer 103, and/or below the resistive layer 103, and/or on a lateral side of the resistive layer 103. For example, a situation where the thermal enhanced layer 104 is formed above the resistive layer 103 is illustrated in FIG. 1. A situation where the thermal enhanced layer 104 is formed below the resistive layer 103 is illustrated in FIG. 2. A situation where the thermal enhanced layer 104 is formed both above and below the resistive layer 103 is illustrated in FIG. 3, that is, the thermal enhanced layer comprises a first thermal enhanced layer 104 under the resistive layer 103 and a second thermal enhanced layer 104B above the resistive layer 103. A situation where the thermal enhanced layer 104 is formed above, below and on a lateral side of the resistive layer 103 is illustrated in FIG. 4, that is, the thermal enhanced layer comprises a first thermal enhanced layer 104A under the resistive layer 103, a second thermal enhanced layer 104B above the resistive layer 103, and a third thermal enhanced layer 104C on the lateral side of the resistive layer 103.

Figure 5:
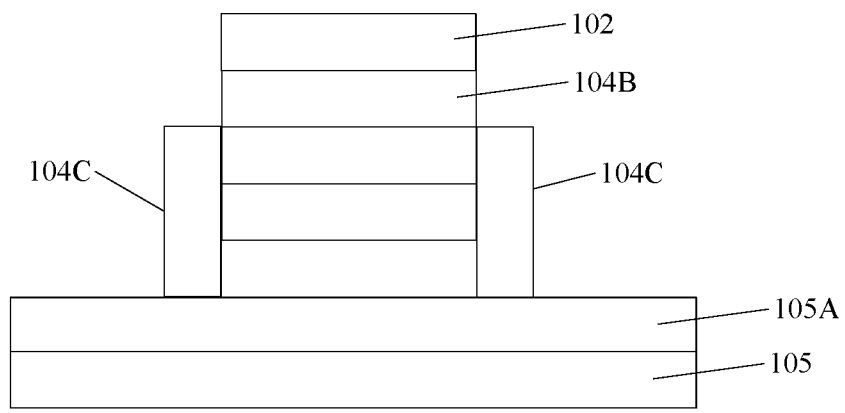
FIG. 5 is a fifth schematic diagram of a resistive random access memory provided by an embodiment of the present disclosure.
Figure 6:
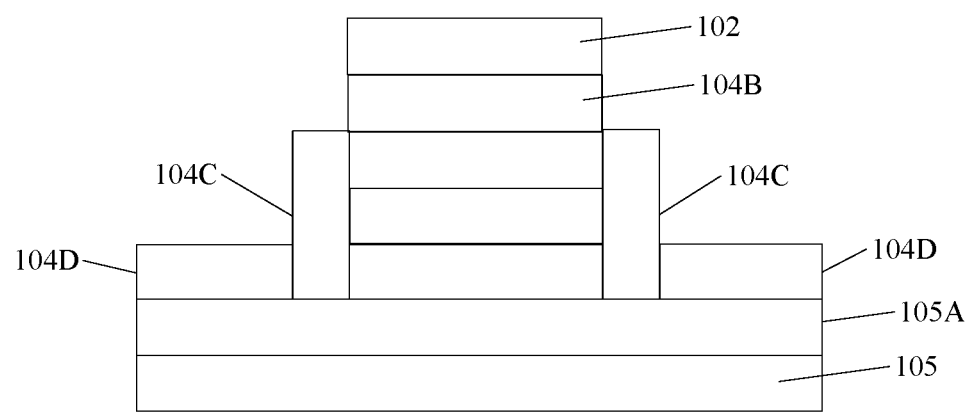
FIG. 6 is a sixth schematic diagram of a resistive random access memory provided by an embodiment of the present disclosure.

For example, in the embodiment, as illustrated in FIG. 5, the resistive random access memory can further comprise a substrate 105, and the first electrode 101, the second electrode 102, the resistive layer 103, and the thermal enhanced layer 104 are on the substrate 105. In the embodiment, a material of the substrate 105 can comprise silicon and/or silicon oxide. For example, the substrate 105 can be a silicon substrate, and a surface of the silicon substrate can be oxidized to form a silicon oxide layer 105A, such as a silicon dioxide layer, and therefore a composite substrate is formed. In the embodiment, as illustrated in FIG. 6, the thermal enhanced layer 104 can further comprise a fourth thermal enhanced layer 104D formed on the substrate 105 and on both lateral sides of the resistive layer 103, and therefore the heat generated by the resistance layer 103 during operation is preserved in all directions. In the embodiment, a plurality of thermal enhanced layers are disposed around the resistive layer 103, thus the heat generated by the resistive layer 103 during operation can be more effectively preserved to prevent heat loss.

In the embodiment, for example, the thermal conductivity of a material of the thermal enhanced layer 104 can range from 0.01 W·m$^{-1}$·K$^{-1}$ to 20 W·m$^{-1}$·K$^{-1}$, and the thermal conductivity of the thermal enhanced layer 104 is much smaller than the thermal conductivities of the first electrode 101 and the second electrodes 102, and therefore the added thermal enhanced layer 104 can prevent or slow down the heat loss of the resistive layer 103 to a certain extent. In the embodiment, the material of the thermal enhanced layer can comprise, for example, anoxic metal oxide, a phase change material or the like. The anoxic metal oxide can comprise, for example, $AlO_x$, $HfO_x$, $SiO_x$, $TiO_x$, $TaO_x$, $WO_x$ or the like. Alternatively, the phase change material can comprise, for example, GST ($Ge_2Sb_2Te_5$) and so on. In the embodiment, the material of the thermal enhanced layer 104 also has a certain electrical conductivity, and the electrical conductivity can range, for example, from 10 μΩ/cm$^2$ to 10 Ω/cm$^2$, so that the thermal enhanced layer 104 cannot affect the first electrode 101 and the second electrode 102 applying voltages to the resistive layer 103. In the embodiment, a thickness of the thermal enhanced layer 104 can range, for example, from 10 nm to 200 nm, for example, the thickness is 50 nm, 100 nm, or 150 nm.

In the embodiment, the material of the resistive layer 103 can comprise any suitable material, such as transition metal oxide, and the transition metal oxide can comprise, for example, AlOx, TaOx, HfOx, SiOx, TiOx, WOx or the like. A thickness of the resistive layer 103 can range, for example, from 1 nm to 30 nm, for example, the thickness is 10 nm, 15 nm, or 20 nm. In the embodiment, the material of the first electrode 101 and/or the second electrode 102 can comprise, for example, Ti, Al, Ni, Ag, Au, W, Cu, Pt, Pd, TiN and so on. A thickness of the first electrode 101 and/or the second electrode 102 can range, for example, from 10 nm to 200 nm, for example, the thickness is 50 nm, 100 nm, or 150 nm.

In the resistive random access memory provided by the embodiment, the thermal enhanced layer is disposed around the resistive layer, and the thermal enhanced layer can preserve the heat generated by the resistive layer during operation, prevent or slow down the heat loss, and therefore the formation of the conductive filaments in the resistive layer can be affected by the thermal effect, the conductive filaments in the resistive layer are formed to be more dispersed, so that under a condition that an external pulse is applied to the resistive random access memory, the conductance of the resistive random access memory can continuously change during both the process of conductance decreasing and the process of conductance increasing. Experiments show that the thermal enhanced layer is disposed around the resistive layer of the resistive random access memory to effectively increase the temperature of the resistive layer. During operation, the temperature of the resistive layer of the resistive random access memory provided in the embodiment can be at least 100K higher than the temperature of a resistive layer in a common resistive random access memory under the same conditions, which indicates that the added thermal enhanced layer can effectively increase the temperature of the resistive layer. Because during operation, a formation area of oxygen vacancies in the common resistive random access memory is limited in a center area of the resistive layer, and therefore a dominant conductive filament is formed. However, in the resistive random access memory provided by the embodiment, the temperature of the resistive layer is higher during operation, and therefore oxygen vacancies can be formed at any position of the resistive layer, so that a plurality of dispersed conductive filaments are formed. Therefore, in the common resistive random access memory, ON and OFF states of a single dominant conductive filament cause a significantly abrupt change of the conductance of the device. However, in the resistive random access memory provided by the embodiment, because a plurality of conductive filaments are formed, ON and OFF states of each conductive filament can only cause a small change of the conductance, and therefore the resistive random access memory provided by the embodiment can implement a property of bidirectional linear gradual change of the conductance.

Figure 7A:
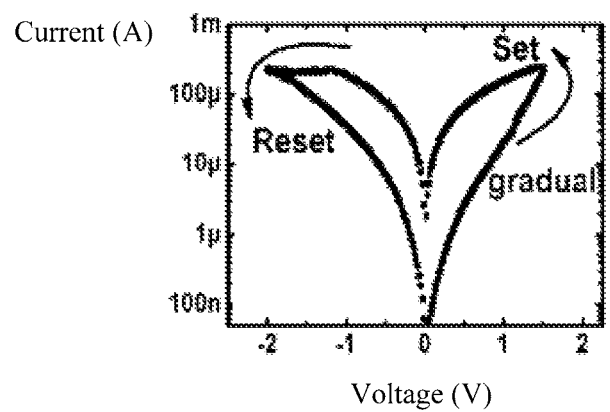
FIGS. 7A and 7B are DC-IV curve graphs of a resistive random access memory provided by an embodiment of the present disclosure and a common resistive random access memory.
Figure 7B:
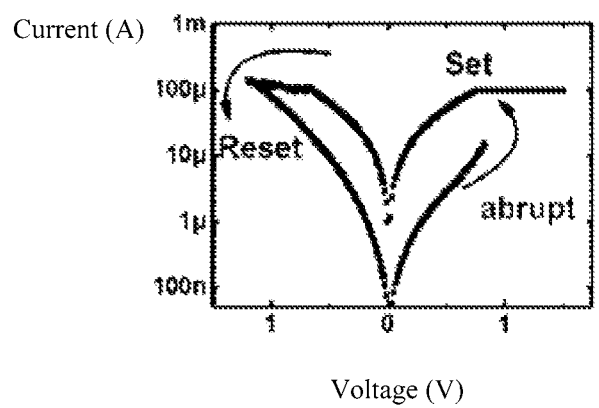

FIGS. 7A and 7B are DC-IV curve graphs of a resistive random access memory provided by an embodiment of the present disclosure and a common resistive random access memory, respectively. It can be seen from FIG. 7A that under the condition that an external pulse is applied to the resistive random access memory, the conductance of the resistive random access memory provided by the embodiment can continuously change during both the process of conductance decreasing and the process of conductance increasing. As illustrated in FIG. 7B, for the common resistive random access memory without the thermal enhanced layer, under the condition of applying an external pulse, the conductance of the resistive random access memory can only continuously change during the process of conductance decreasing, and an abrupt change of the conductance often occurs during the process of conductance increasing. In addition, the resistive random access memory provided by the embodiment shows the property of bidirectional linear gradual change of the conductance when performing a pulse test.

Figure 8A:
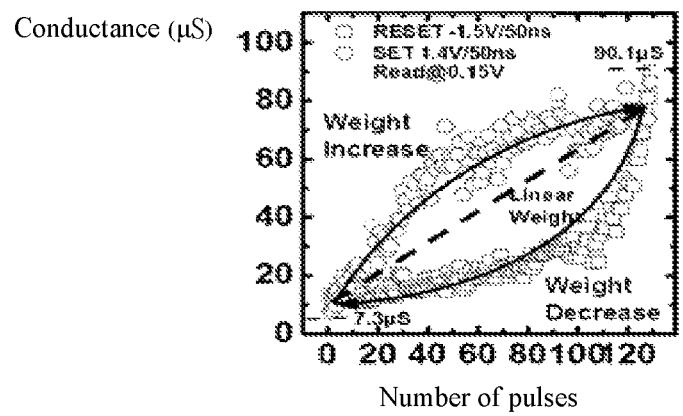
FIGS. 8A and 8B are pulse test result diagrams of a resistive random access memory provided by an embodiment of the present disclosure and a common resistive random access memory.
Figure 8B:
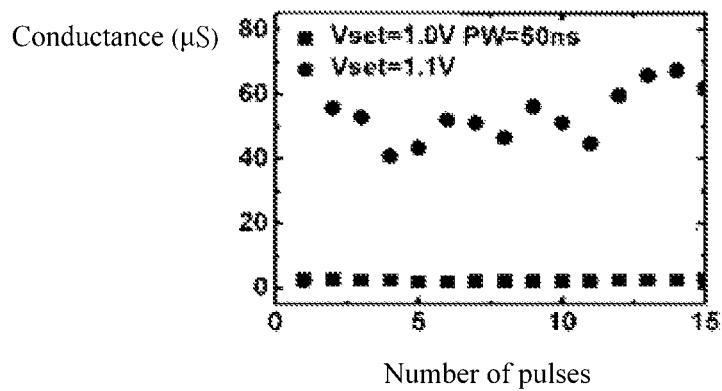
Figure 9:
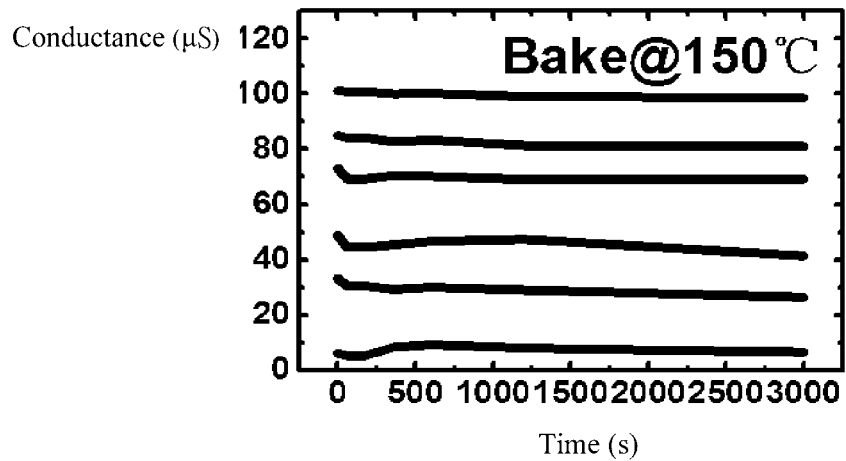
FIG. 9 is a test result diagram of a retention property of a resistive random access memory provided by an embodiment of the present disclosure.

As illustrated in FIG. 8A, in a case where a pulse of 1.4V/50 ns is applied to the resistive random access memory, the conductance of the resistive random access memory is gradually increased from 7 μS to 80 μS; in a case where a pulse of 1.5V/50 ns is applied, the conductance of the resistive random access memory is gradually reduced from 90 μS to 8 μS. It can be seen that the resistive random access memory provided by the embodiment has a relatively large gradual-change window and exhibits a good linear property. As illustrated in FIG. 8B, the conductance of the common resistive random access memory without the thermal enhanced layer shows an abrupt change in the pulse test, in a case where an operation pulse of 1V/50 ns is applied, the conductance of the common resistive random access memory hardly changes, and in a case where the operation pulse is increased to 1.1V/50 ns, after the operation pulse is applied, the conductance of the common resistive random access memory suddenly increases to 60 μS, and continuous change of the conductance cannot be achieved. In addition, the resistive random access memory provided by the embodiment has a good maintaining characteristic. As illustrated in FIG. 9, the conductance of the resistive random access memory is substantially unchanged after the resistive random access memory is baked at 150° C. for 3000 s.

Figure 10:
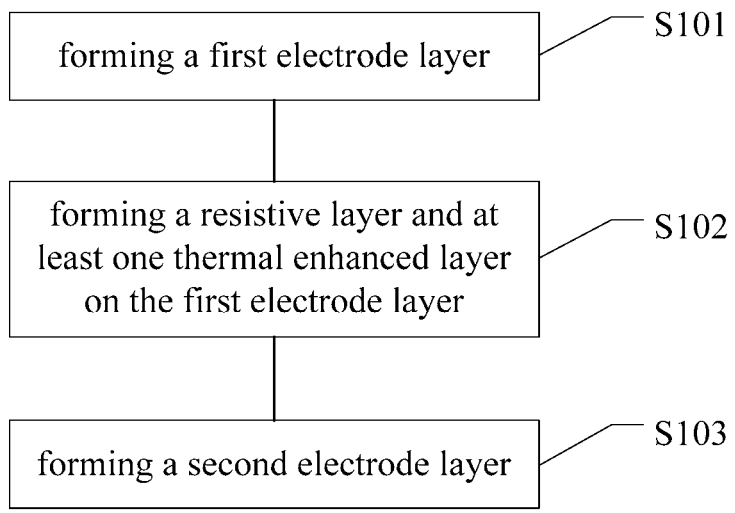
FIG. 10 is a flow chart of a method of manufacturing a resistive random access memory provided by an embodiment of the present disclosure.

At least one embodiment of the present disclosure provides a method of manufacturing a resistive random access memory, the method can at least manufacture a resistive random access memory having a simple stacked structure. As illustrated in FIG. 10, the method comprises steps S101 to S103.

Step S101: forming a first electrode layer.

As illustrated in FIG. 11A, a first electrode layer 301 is first formed on the substrate 305. In the embodiment, a material of the substrate 305 can comprise a silicon material or a composite material of silicon and silicon oxide, which is not limited in the embodiment. For example, the first electrode layer is formed on the substrate 305 by, for example, a physical vapor deposition method or the like. A material of the first electrode layer can comprise, for example, Ti, Al, Ni, Ag, Au, W, Cu, Pt, Pd, TiN, or other suitable material. A thickness of the first electrode layer can range, for example, from 10 nm to 200 nm, for example, the thickness is 50 nm or 150 nm.

Step S102: forming a resistive layer and at least one thermal enhanced layer on the first electrode layer.

As illustrated in FIGS. 11B1 to 11B3, after the first electrode layer 301 is formed, a resistive layer 303 and at least one thermal enhanced layer 304 are formed on the substrate 305 and the first electrode layer 301. In the embodiment, the resistive layer 303 and the thermal enhanced layer 304 can be formed by, for example, a physical vapor deposition method, an atomic layer deposition method or the like. In the embodiment, as illustrated in FIG. 11B1, the resistive layer 303 can be formed on the substrate 305 and the first electrode layer 301, and then the thermal enhanced layer 304 is formed. Alternatively, as illustrated in FIG. 11B2, the thermal enhanced layer 304 can be formed on the substrate 305 and the first electrode layer 301, and then the resistive layer 303 is formed. Alternatively, as illustrated in FIG. 11B3, a first thermal enhanced layer 304A can be formed on the substrate 305 and the first electrode layer 301, and then the resistive layer 303 is formed, and then a second thermal enhanced layer 304B is formed, so that the thermal enhanced layers are formed on both an upper side and a lower side of the resistive layer 303. In the embodiment, a material of the resistive layer 303 can comprise any suitable material, such as transition metal oxide, and the transition metal oxide can comprise, for example, AlOx, TaOx, HfOx, SiOx, TiOx, WOx or the like.

A formation thickness of the resistive layer 303 can range, for example, from 1 nm to 30 nm, for example, the thickness is 10 nm or 20 nm. In the embodiment, a material of the thermal enhanced layer 304 can comprise any suitable material, such as anoxic metal oxide, a phase change material or the like, and the anoxic metal oxide can comprise, for example, AlOx, HfOx, SiOx, TiOx, TaOx, WOx and so on, and an oxygen deficiency degree of the anoxic metal oxide can be controlled by controlling an oxygen partial pressure in the forming process of the anoxic metal oxide. The phase change material can comprise any suitable material, such as GST ($Ge_2Sb_2Te_5$) and so on. A formation thickness of the thermal enhanced layer 304 can range, for example, from 10 nm to 200 nm, for example, the thickness is 70 nm or 140 nm.

Step S103: forming a second electrode layer.

Figure 11C:
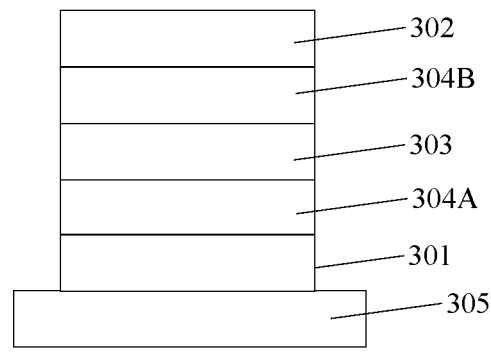

As illustrated in FIG. 11C, after the thermal enhanced layer 304 and the resistive layer 303 are formed, a second electrode layer 302 is formed on the thermal enhanced layer 304 if the thermal enhanced layer 304 is disposed on the resistive layer 303, or on the resistive layer 303 if the resistive layer 303 is disposed on the thermal enhanced layer 304, for example, by a physical vapor deposition method or the like. A material of the second electrode layer 302 can comprise, for example, Ti, Al, W, Cu, Pt, Pd, TiN and so on, and a formation thickness of the second electrode layer 302 can range, for example, from 10 nm to 200 nm, for example, the thickness is 60 nm or 160 nm.

Figure 11D:
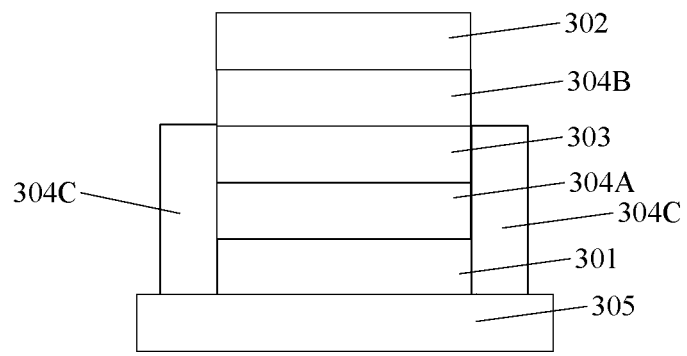
Figure 11E:
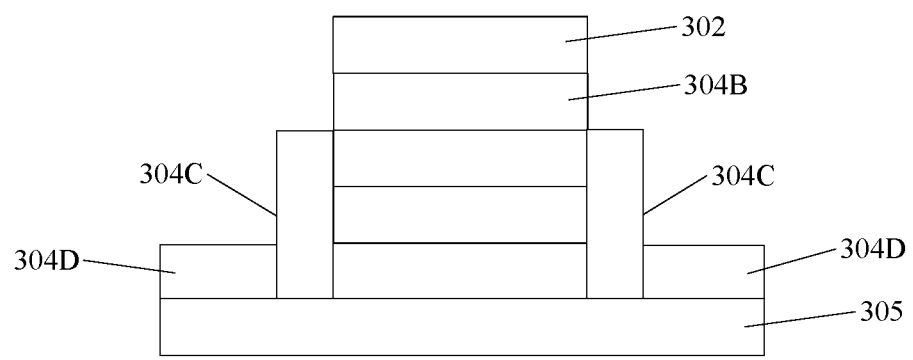

In the embodiment, for example, the second electrode layer 302, the thermal enhanced layer 304, the resistive layer 303, and the first electrode layer 301 can be etched by a single photolithography process to form a pattern. In the embodiment, the thermal enhanced layer can be formed, for example, at positions such as a lateral side of the resistive layer 303, a lateral side of the first electrode layer 301, and so on. For example, as illustrated in FIG. 11D, after the photolithography process is completed, the material of the thermal enhanced layer is deposited on lateral sides of functional layers such as the resistive layer 303 and the first electrode layer 301 to form a third thermal enhanced layer 304C on the lateral sides of respective functional layers. In another example of the embodiment, as illustrated in FIG. 11E, the material of the thermal enhanced layer can also be formed on a portion of the substrate 305 to form a fourth thermal enhanced layer 304D.

The method of manufacturing a resistive random access memory provided by the embodiment can at least manufacture a resistive random access memory having a simple stacked structure. In the method, the thermal enhanced layer is formed at a plurality of orientations around the resistive layer of the resistive random access memory, and the thermal enhanced layer can effectively preserve the heat generated by the resistive layer during operation, prevent the heat loss, and therefore the conductive filaments are formed to be more dispersed in the resistive layer by the thermal effect, so that under a condition that an external pulse is applied to the resistive random access memory, the conductance of the resistive random access memory can continuously change during both the process of conductance decreasing and the process of conductance increasing.

At least one embodiment of the present disclosure provides a method of manufacturing a resistive random access memory. As illustrated in FIG. 12, the method comprises steps S201-S204.

Step S201: forming a first electrode pattern as a first electrode layer on the substrate.

FIG. 13A1 is a plane diagram of a resistive random access memory when forming a first electrode pattern in a manufacture process of the resistive random access memory, and FIG. 13A2 is a cross-sectional diagram of the resistive random access memory taken along line A-A illustrated in FIG. 13A1. As illustrated in FIGS. 13A1 and 13A2, a first electrode 101 is first formed on the substrate 105. In the embodiment, a material of the substrate 105 can comprise, for example, silicon and silicon oxide. For example, a silicon material can be selected as the material of the substrate 105, and then, if necessary, a silicon oxide layer 105A can be formed on the surface of the substrate 105 by an oxidation process, the silicon oxide can be, for example, silicon dioxide, and therefore a composite substrate comprising silicon and silicon oxide are formed. Then, a first electrode layer is formed on the substrate 105 by, for example, a physical vapor deposition method or the like. A material of the first electrode layer can comprise, for example, Ti, Al, Ni, Ag, Au, W, Cu, Pt, Pd, TiN and so on. A formation thickness of the first electrode layer can range, for example, from 10 nm to 200 nm, for example, the thickness is 50 nm, 100 nm or 150 nm. The first electrode layer is then etched by a photolithography process to form a patterned first electrode 101.

Step S202: forming a resistive layer and at least one thermal enhanced layer on the substrate and the first electrode pattern.

FIG. 13B1 is a plane diagram of a resistive random access memory when forming the resistive layer and the thermal enhanced layer in the manufacture process of the resistive random access memory, and FIGS. 13B2-13B4 are cross-sectional diagrams of the resistive random access memory taken along line A-A illustrated in FIG. 13B1. As illustrated in FIGS. 13B1 to 13B4, after the first electrode 101 is formed, a resistive layer 103 and at least one thermal enhanced layer 104 are formed on the substrate 105 and the first electrode 101. In the embodiment, the resistive layer 103 and the thermal enhanced layer 104 can be formed by, for example, a physical vapor deposition method, an atomic layer deposition method or the like. In the embodiment, as illustrated in FIG. 13B2, the resistive layer 103 can be formed on the substrate 105 and the first electrode 101, and then the thermal enhanced layer 104 is formed. Alternatively, as illustrated in FIG. 13B3, the thermal enhanced layer 104 is formed on the substrate 105 and the first electrode 101, and then the resistive layer 103 is formed. Alternatively, as illustrated in FIG. 13B4, a first thermal enhanced layer 104A can be formed on the substrate 105 and the first electrode 101, and then the resistive layer 103 is formed, and then a second thermal enhanced layer 104B is formed, so that the thermal enhanced layers are formed on both an upper side and a lower side of the resistive layer 103.

In the embodiment, a material of the resistive layer 103 can comprise any suitable material, such as transition metal oxide, and the transition metal oxide can comprise, for example, AlOx, TaOx, HfOx, SiOx, TiOx, Wox and so on. A formation thickness of the resistive layer 103 can range, for example, from 1 nm to 30 nm, for example, the thickness is 10 nm or 15 nm. In the embodiment, a material of the thermal enhanced layer can comprise any suitable material, such as anoxic metal oxide, a phase change material or the like, and the anoxic metal oxide can comprise, for example, AlOx, HfOx, SiOx, TiOx, TaOx, WOx and so on. An oxygen deficiency degree of the anoxic metal oxide can be controlled by controlling an oxygen partial pressure in the forming process of the anoxic metal oxide. The phase change material can comprise, for example, GST ($Ge_2Sb_2Te_5$) and so on. A formation thickness of the thermal enhanced layer 104 can range, for example, from 10 nm to 200 nm, for example, the thickness is 50 nm or 100 nm.

Step S203: forming a second electrode pattern as a second electrode layer on the thermal enhanced layer or the resistive layer.

FIG. 13C1 is a plane diagram a resistive random access memory when forming a second electrode pattern in the manufacture process of the resistive random access memory, and FIG. 13C2 is a cross-sectional diagram of the resistive random access memory taken along line A-A illustrated in FIG. 13C1. As illustrated in FIGS. 13C1 to 13C2, after the thermal enhanced layer 104 and the resistive layer 103 are formed, a second electrode layer can be formed by, for example, a physical vapor deposition method or the like on the thermal enhanced layer 104 if the thermal enhanced layer 104 is disposed on the resistive layer 303, or on the resistive layer 103 if the resistive layer 103 is disposed on the thermal enhanced layer 104. A material of the second electrode layer can comprise, for example, Ti, Al, Ni, Ag, Au, W, Cu, Pt, Pd, TiN and so on, and a formation thickness of the second electrode layer can range, for example, from 10 nm to 200 nm, for example, the thickness is 50 nm or 150 nm. The second electrode layer is then etched by a photolithography process to form a patterned second electrode 102.

Step S204: etching the thermal enhanced layer and the resistive layer to expose a portion of the first electrode pattern.

Figure 13D:
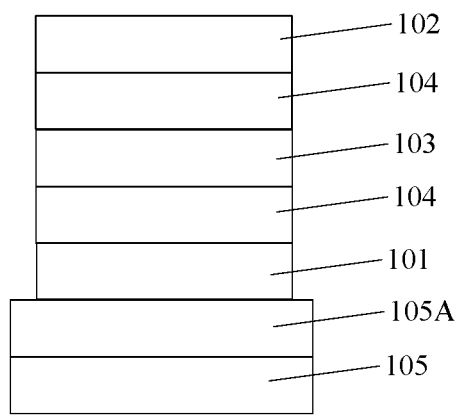
Figure 13D:
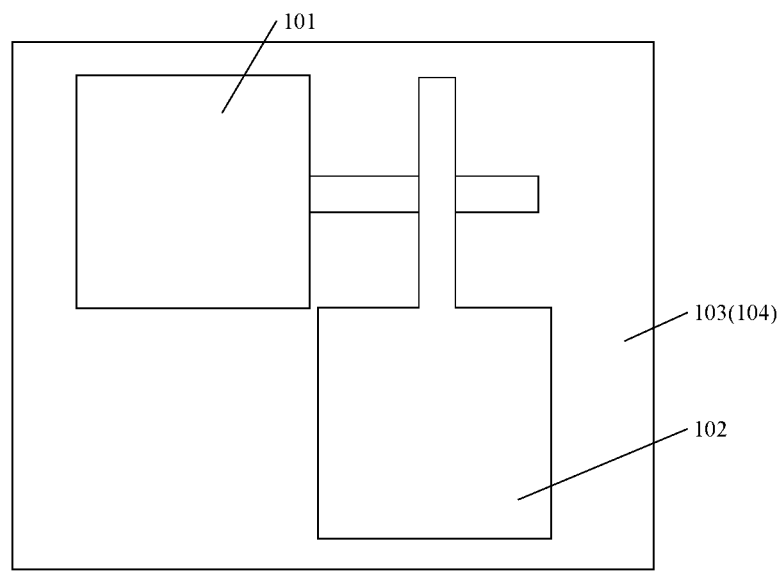

FIG. 13D is a plane diagram of a resistive random access memory when etching the thermal enhanced layer and the resistive layer to expose a portion of the first electrode pattern in the manufacture process of the resistive random access memory. As illustrated in FIG. 13D, after the second electrode 102 is formed, for example, the thermal enhanced layer 104 and the resistive layer 103 can be etched by a photolithography process to expose a portion of the first electrode 101. In the embodiment, for example, the thermal enhanced layer 104 and the resistive layer 103 can be etched by a single photolithography process, to expose the portion of the first electrode 101 as a pad.

In the resistive random access memory provided by the embodiment, the thermal enhanced layer is formed around the resistive layer of the resistive random access memory, and the thermal enhanced layer can preserve the heat generated by the resistive layer during operation, prevent the heat loss, and furthermore the formation of the conductive filaments in the resistive layer can be affected by the thermal effect, the conductive filaments are formed to be more dispersed in the resistive layer, so that the conductance of the resistive random access memory can continuously change, under a condition that an external pulse is applied to the resistive random access memory, during both the process of conductance decreasing and the process of conductance increasing.

At least one embodiment of the present disclosure provides a method of manufacturing a resistive random access memory, and the manufacture method is applied to any one of the above-described resistive random access memories. As illustrated in FIG. 14, the method comprises steps S301-S306.

Step S301: forming a first electrode pattern.

FIG. 15A1 is a plane view of a resistive random access memory when forming a first electrode pattern in a manufacture process of the resistive random access memory, and FIG. 15A2 is a cross-sectional diagram of the resistive random access memory taken along line B-B illustrated in FIG. 15A1. As illustrated in FIGS. 15A1 and 15A2, a first electrode 201 is first formed on a substrate 205. In the embodiment, a material of the substrate 205 can comprise a silicon material or a composite material of silicon and silicon oxide, which is not limited in the embodiment. Then, a first electrode layer is formed on the substrate 205 by, for example, a physical vapor deposition method or the like. A material of the first electrode layer can comprise, for example, Ti, Al, Ni, Ag, Au, W, Cu, Pt, Pd, TiN and so on. A formation thickness of the first electrode layer can range, for example, from 10 nm to 200 nm, for example, the thickness is 60 nm or 120 nm. The first electrode layer is then etched by a photolithography process to form a patterned first electrode 201.

Step S302: forming a resistive layer or forming a stack layer of a first thermal enhanced layer and the resistive layer.

FIG. 15B1 is a plane diagram of a resistive random access memory when forming a resistive layer or a stack layer of a first thermal enhanced layer and the resistive layer in a manufacture process of the resistive random access memory, and FIGS. 15B2 and 15B3 are cross-sectional diagrams of the resistive random access memory taken along line B-B illustrated in FIG. 15B1. As illustrated in FIGS. 15B1 to 15B3, after the first electrode 201 is formed, a resistive layer 203 is formed on the substrate 205 and the first electrode 201 (the situation illustrated in FIG. 15B2), or a stack layer of a first thermal enhanced layer 204A and the resistive layer 203 layer is formed on the substrate 205 and the first electrode 201 (the situation illustrated in FIG. 15B3). For example, the resistive layer 203 and the first thermal enhanced layer 204A can be formed by a physical vapor deposition method, an atomic layer deposition method or the like. In the embodiment, a material of the resistive layer 203 can comprise any suitable material, such as transition metal oxide, and the transition metal oxide can comprise, for example, AlOx, TaOx, HfOx, SiOx, TiOx, WOx and so on. A formation thickness of the resistive layer 203 can range, for example, from 1 nm to 30 nm, for example, the thickness is 10 nm or 20 nm. In the embodiment, a material of the thermal enhanced layer can comprise any suitable material, such as anoxic metal oxide, a phase change material or the like, and the anoxic metal oxide can comprise, for example, AlOx, HfOx, SiOx, TiOx, TaOx, WOx and so on. An oxygen deficiency degree of the anoxic metal oxide can be controlled by controlling an oxygen partial pressure in the forming process of the anoxic metal oxide. The phase change material can comprise, for example, GST ($Ge_2Sb_2Te_5$) and so on; and a formation thickness of the thermal enhanced layer 204 can range, for example, from 10 nm to 200 nm, for example, the thickness is 80 nm or 160 nm.

Step S303: etching at least one of the resistive layer, the first thermal enhanced layer and the first electrode pattern.

FIG. 15C1 is a plane diagram of a resistive random access memory when etching at least one of the resistive layer, the first thermal enhanced layer or the first electrode pattern in a manufacture process of the resistive random access memory, and FIG. 15C2 is a cross-sectional diagram of the resistive random access memory taken along line B-B illustrated in FIG. 15C1. As illustrated in FIGS. 15C1 to 15C2, at least one of the resistive layer 203, the first thermal enhanced layer 204A, or the first electrode 201 is etched to expose at least a portion of one of a lateral side of the resistive layer, a lateral side of the first thermal enhanced layer, and a lateral side of the first electrode pattern. For example, in a case where the situation illustrated in FIG. 15B2 is formed in the step S202, for example, the resistive layer 203 can be etched, or the resistive layer 203 and the first electrode 201 can be etched, to expose a lateral side of the resistive layer 203, or expose a lateral side of the resistive layer 203 and a lateral side of the first electrode 201, so as to form the thermal enhanced layer on the lateral side of the resistive layer 203 or on both the lateral side of the resistive layer 203 and the lateral side of the first electrode 201 later. For another example, in a case where the situation illustrated in FIG. 15B3 is formed in the step S202, for example, the resistive layer 203 and the first thermal enhanced layer 204A can be etched, or the resistive layer 203, the first thermal enhanced layer 204A, and the first electrode 201 can be etched, to expose a lateral side of the resistive layer 203 and a lateral side of the first thermal enhanced layer 204A, or expose a lateral side of the resistive layer 203, a lateral side of the first thermal enhanced layer 204A, and a lateral side of the first electrode 201, so as to form the thermal enhanced layer on these lateral sides later.

Step S304: forming a continuous second thermal enhanced layer.

FIG. 15D1 is a plane diagram of a resistive random access memory when forming a continuous second thermal enhanced layer in a manufacture process of the resistive random access memory, and FIGS. 15D2 and 15D3 are cross-sectional diagrams of the resistive random access memory taken along line B-B illustrated in FIG. 15D1. As illustrated in FIGS. 15D1-15D3, after the etching process of the step S303 is completed, a continuous second thermal enhanced layer is formed on a surface of the resistive layer 203 and on at least the portion of one of the lateral side of the resistive layer 203, the lateral side of the first thermal enhanced layer 204A, and the lateral side of the first electrode 201 that are exposed by the etching process. The continuous second thermal enhanced layer can comprise a second thermal enhanced layer 204B on the surface of the resistive layer 203 and a third thermal enhanced layer 204C on the lateral sides of respective functional layers (the situation illustrated in FIG. 15D2). The continuous second thermal enhanced layer can also comprise a fourth thermal enhanced layer 204D formed on a portion of the substrate 205 (the situation illustrated in FIG. 15D3).

It should be noted that the continuous second thermal enhanced layer means that the second thermal enhanced layer is formed simultaneously on the lateral sides of respective functional layers and the surface of the resistive layer 203, and a situation where the second thermal enhanced layer is discontinuous can also exist. For example, the discontinuity may be at a boundary of a lateral side and a surface of a functional layer, for example, in the situation as illustrated in FIG. 15D4, a discontinuity between the second thermal enhanced layer 204B and the third thermal enhanced layer 204C is at a boundary of the lateral side and the surface of the resistive layer 203.

Step S305: forming a second electrode pattern.

FIG. 15E1 is a plane diagram of a resistive random access memory when forming a second electrode pattern in a manufacture process of the resistive random access memory, and FIGS. 15E2 and 15E3 are cross-sectional diagrams of the resistive random access memory taken along line B-B illustrated in FIG. 15E1. As illustrated in FIGS. 15E1 to 15E3, after the thermal enhanced layer and the resistive layer 203 are formed, a second electrode layer is formed by a physical vapor deposition method or the like on the thermal enhanced layer if the thermal enhanced layer is disposed on the resistive layer 203, or on the resistive layer 203 if the resistive layer 203 is disposed on the thermal enhanced layer. A material of the second electrode layer can comprise, for example, Ti, Al, Ni, Ag, Au, W, Cu, Pt, Pd, TiN and so on, and a formation thickness of the second electrode layer can range, for example, from 10 nm to 200 nm, for example, the thickness is 100 nm or 130 nm. The second electrode layer is then etched by a photolithography process to form a patterned second electrode 202.

Step S306: etching at least the second thermal enhanced layer to expose a portion of the first electrode pattern.

Figure 15F:
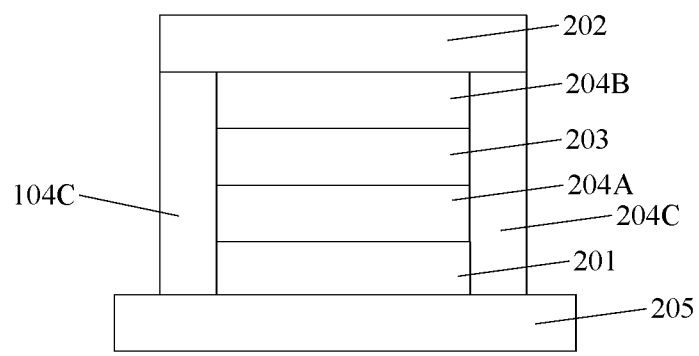
Figure 15F:
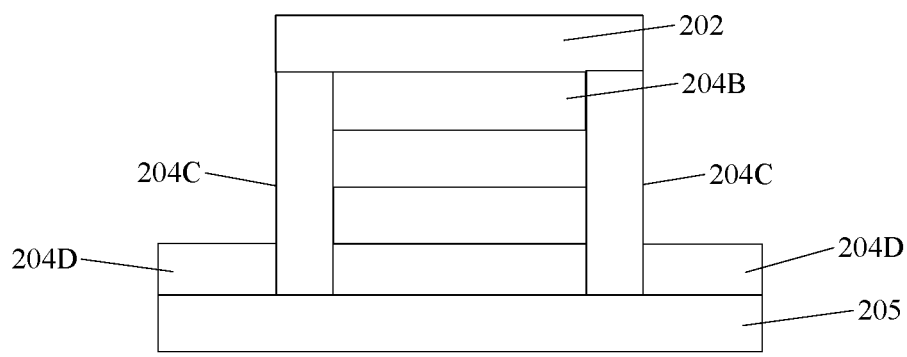
Figure 15F:
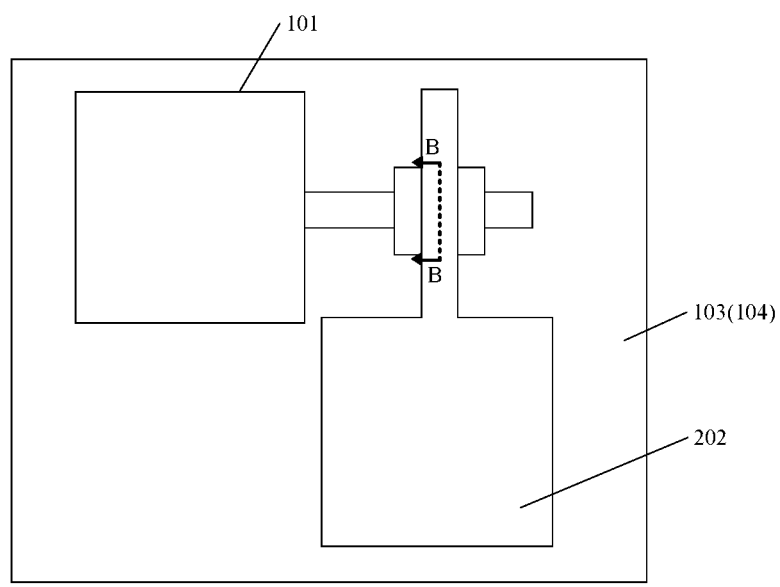

FIG. 15F is a plane diagram of a resistive random access memory when etching at least the second thermal enhanced layer to expose a portion of the first electrode pattern in a manufacture process of the resistive random access memory. As illustrated in FIG. 15F, after the second electrode 202 is formed, the thermal enhanced layer 204 and the resistive layer 203 are etched, for example, by a photolithography process to expose a portion of the first electrode 201. In the embodiment, for example, the thermal enhanced layer 204 and the resistive layer 203 are etched by a single photolithography process to expose the portion of the first electrode 201 as a pad.

In the resistive random access memory provided by the embodiment, the thermal enhanced layer is formed at a plurality of orientations around the resistive layer of the resistive random access memory, and the thermal enhanced layer can effectively preserve the heat generated by the resistive layer during operation, prevent the heat loss, and therefore the conductive filaments are formed to be more dispersed in the resistive layer by the thermal effect, so that the conductance of the resistive random access memory can continuously change, under a condition that an external pulse is applied to the resistive random access memory, during both the process of conductance decreasing and the process of conductance increasing. The resistive random access memory having a property of conductance bidirectional linear gradual change provided by the embodiment has a good application prospect in the field of brain-like computers.

The following statements should be noted:

(1) The accompanying drawings involve only the structure(s) in connection with the embodiment(s) of the present disclosure, and other structure(s) can be referred to common design(s).

(2) For the purpose of clearly illustrating, in accompanying drawings for illustrating the embodiment(s) of the present disclosure, the thickness of a layer or a structure may be enlarged or reduced, that is, the drawings are not drawn in a real scale. However, it should understood that, in the case in which a component or element such as a layer, a film, an area, a substrate or the like is referred to be "on" or "under" another component or element, it may be directly on or under the another component or element or a component or element may be interposed therebetween.

(3) In case of no conflict, the embodiments of the present disclosure and the features in the embodiment(s) can be combined with each other to obtain new embodiment(s).

The above descriptions are only specific embodiments of the present disclosure, but the protection scope of the present disclosure is not limited thereto, any modifications or substitutions easily occur to those skilled in the art within the technical scope of the present disclosure should be within the protection scope of the present disclosure. Therefore, the protection scope of the present disclosure should be determined by the protection scope of the claims.

What is claimed is:

1. A resistive random access memory, comprising:
a first electrode;
a second electrode;
a resistive layer between the first electrode and the second electrode; and
a plurality of thermal enhanced layers, wherein the plurality of thermal enhanced layers is adjacent to the resistive layer, a thermal conductivity of the plurality of thermal enhanced layers is less than a thermal conductivity of the first electrode and a thermal conductivity of the second electrode, and the plurality of thermal enhanced layers is configured to preserve heat generated by the resistive layer,
the plurality of thermal enhanced layers and the resistive layer are independent of each other,
the plurality of thermal enhanced layers are on a top side of the resistive layer, and on a bottom side of the resistive layer, and on lateral sides of the resistive layer, respectively, the top side and the bottom side of the resistive layer are respectively two sides of the resistive layer in a direction in which the first electrode and the second electrode are stacked, and the lateral sides of the resistive layer are two sides of the resistive layer in a direction perpendicular to the direction in which the first electrode and the second electrode are stacked.

2. The resistive random access memory according to claim 1, wherein the thermal conductivity of the first electrode and/or the thermal conductivity of the second electrode are/is twice, five times or more than ten times as high as the thermal conductivity of the plurality of thermal enhanced layers.

3. The resistive random access memory according to claim 1, wherein the thermal conductivity of a material of the plurality of thermal enhanced layers ranges from 0.01 $W \cdot m^{-1} \cdot K^{-1}$ to 20 $W \cdot m^{-1} \cdot K^{-1}$.

4. The resistive random access memory according to claim 1, further comprising a substrate,
wherein the first electrode, the second electrode, the resistive layer, and the plurality of thermal enhanced layers are on the substrate.

5. The resistive random access memory according to claim 4, wherein a material of the substrate comprises silicon and/or silicon oxide.

6. The resistive random access memory according to claim 1, wherein a material of the first electrode and/or a material of the second electrode comprises Ti, Al, Ni, Ag, Au, W, Cu, Pt, Pd or TiN.

7. The resistive random access memory according to claim 1, wherein a material of the resistive layer comprises transition metal oxide.

8. The resistive random access memory according to claim 7, wherein the transition metal oxide comprises $AlO_x$, $TaO_x$, $HfO_x$, $SiO_x$, $TiO_x$ or $WO_x$.

9. The resistive random access memory according to claim 1, wherein a thickness of the resistive layer ranges from 1 nm to 30 nm.

10. The resistive random access memory according to claim 1, wherein an electrical conductivity of a material of the plurality of thermal enhanced layers ranges from 10 $\mu\Omega/cm^2$ to 10 $\Omega/cm^2$.

11. The resistive random access memory according to claim 1, wherein a material of the plurality of thermal enhanced layers comprises anoxic metal oxide or a phase change material.

12. The resistive random access memory according to claim 11, wherein the anoxic metal oxide comprises $AlO_x$, $HfO_x$, $SiO_x$, $TiO_x$, $TaO_x$ or $WO_x$; alternatively, the phase change material comprises $Ge_2Sb_2Te_5$.

13. The resistive random access memory according to claim 1, wherein a thickness of the plurality of thermal enhanced layers ranges from 10 nm to 200 nm.

* * * * *